US012082342B2

(12) United States Patent
Long et al.

(10) Patent No.: US 12,082,342 B2
(45) Date of Patent: Sep. 3, 2024

(54) PRINTED CIRCUIT BOARD CONFIGURATION BLOCKS AND EDGE PROJECTIONS

(71) Applicant: MACOM Technology Solutions Holdings, Inc., Lowell, MA (US)

(72) Inventors: Rathnait Long, North Andover, MA (US); Richard Allen Cory, Dracut, MA (US); Gerald Comtois, Londonderry, NH (US); Scott Donahue, Lunenburg, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 129 days.

(21) Appl. No.: 17/807,037

(22) Filed: Jun. 15, 2022

(65) Prior Publication Data

US 2023/0413447 A1    Dec. 21, 2023

(51) Int. Cl.
*H05K 1/18* (2006.01)
*H05K 1/02* (2006.01)

(52) U.S. Cl.
CPC .......... *H05K 1/184* (2013.01); *H05K 1/0224* (2013.01); *H05K 2201/09227* (2013.01); *H05K 2201/10984* (2013.01)

(58) Field of Classification Search
CPC ..... H05K 1/0224; H05K 1/0266; H05K 1/184
See application file for complete search history.

(56) References Cited

U.S. PATENT DOCUMENTS

2008/0166497 A1* 7/2008 Hsu ...................... H05K 1/0266
427/552

* cited by examiner

*Primary Examiner* — Jeremy C Norris
(74) *Attorney, Agent, or Firm* — Perilla Knox & Hildebrandt LLP; Jason M. Perilla

(57) ABSTRACT

Examples of printed circuit boards (PCBs) with board configuration blocks and board edge projections are described. In one example, a PCB includes a core material and a metal layer comprising a plurality of metal traces on the core material. The plurality of metal traces can include component interconnect traces and a board configuration block. The board configuration block can include a plan diagram for the PCB, an operational diagram for the PCB, or a combination of plan and operational diagrams. In other examples, a PCB can include a core material having a peripheral edge. The peripheral edge can include one or more board edge scheme projections positioned within projection edge regions of the peripheral edge. The scheme projections have a projection shape based on operational characteristics for the PCB. In some cases, the board configuration blocks can be located on the board edge scheme projections.

20 Claims, 7 Drawing Sheets

PRINTED CIRCUIT BOARD CONFIGURATION BLOCKS AND EDGE PROJECTIONS

BACKGROUND

A printed circuit board (PCB) is a laminated structure of conductive metal and insulating core material layers. Each metal layer of a PCB can include a pattern of metal pads, traces, and other conductors that provide electrical connections on that conductive layer, and plated vias can be relied upon for connections between metal layers of the PCB. PCBs can be used to electrically connect electronic components to each other using solder connections between the electronic components and the metal pads on the PCB. PCBs also mechanically support the electronic components on the metal pads between the metal traces, and the metal pads are typically formed in certain shapes which correspond to the terminals of the electronic components. The electronic components are typically soldered onto the metal pads of PCBs to both electrically connect and mechanically fasten them to the PCB. PCBs are used in many electronic products.

BRIEF DESCRIPTION OF THE DRAWINGS

Aspects of the present disclosure can be better understood with reference to the following drawings. It is noted that the elements in the drawings are not necessarily drawn to scale, with emphasis instead being placed upon illustrating the principles of the examples. In the drawings, like reference numerals designate like or corresponding, but not necessarily the same, elements throughout the figures.

DETAILED DESCRIPTION

As noted above, a printed circuit board (PCB) is a laminated structure of conductive metal and insulating core material layers. Each metal layer of a PCB can include a pattern of metal pads, traces, and other conductors that provide electrical connections on that conductive layer, and plated vias can be relied upon for connections between metal layers of the PCB. PCBs can be used to electrically connect electronic components to each other using the metal traces, which extend between the electronic components and the metal pads on the PCB. PCBs also mechanically support the electronic components on the metal pads between the metal traces, and the metal pads are typically formed in certain shapes which correspond to the terminals of the electronic components. The electronic components can be electrically coupled to the metal pads and traces on PCBs in a variety of ways, such as using solder, conductive epoxy, die bumping, flip chip couplings, and other approaches.

Because PCBs are manufactured for such a wide range of purposes and products, it can be relatively difficult to distinguish the purpose of one PCB from another. In development environments, for example, engineers may work with several different types of PCB boards over a relatively short period of time, and it can be difficult to distinguish the operational and functional capabilities of many different PCBs from each other.

In the context outlined above, examples of PCBs with board configuration blocks and board edge scheme projections are described. In one example, a PCB includes a core material and a metal layer comprising a plurality of metal traces on the core material. The plurality of metal traces can include component interconnect traces and a board configuration block. The board configuration block can include a plan diagram for the PCB, an operational diagram for the PCB, or a combination of plan and operational diagrams. In other examples, a PCB can include a core material having a peripheral edge. The peripheral edge can include one or more board edge scheme projections positioned within projection edge regions of the peripheral edge. The edge scheme projections have a scheme or projection shape based on functional or operational characteristics for the PCB. In some cases, the board configuration blocks can be located on the board edge scheme projections. The board configuration blocks and board edge scheme projections can provide a range of details for the use and operation of many different PCBs, such as references to and relative locations of the components on the PCBs, input connections for the PCBs, output connections for the PCBs, operational capabilities and functions of the PCBs, and other information relied upon by individuals to operate the PCBs in one or more ways.

Figure 1:
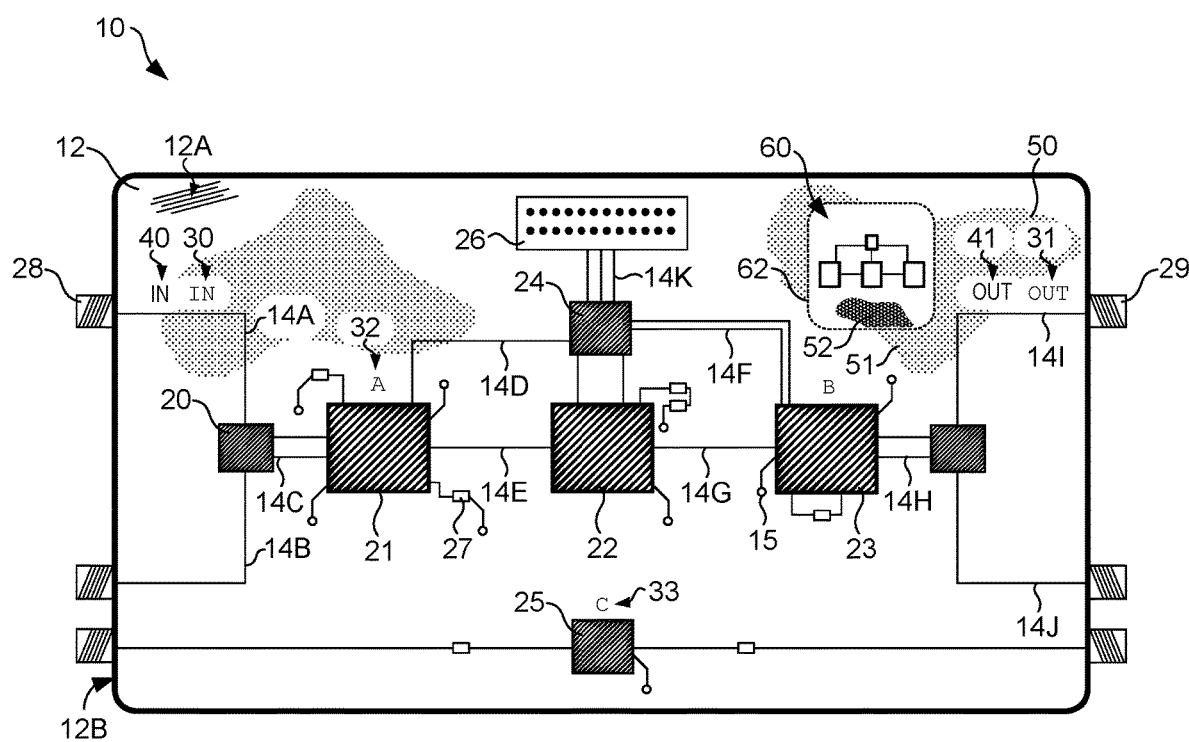
FIG. 1 illustrates an example printed circuit board (PCB) with a board configuration block according to various examples described herein.

Turning to the drawings, FIG. 1 illustrates an example printed circuit board (PCB) 10 with a board configuration block according to various examples described herein. The top outer surface of the PCB 10 is shown in FIG. 1. The PCB 10 is provided as a representative example. The illustration in FIG. 1 is not exhaustive, and the PCB 10 can include other components that are not illustrated in FIG. 1. Additionally, one or more components shown in FIG. 1 can be omitted in some cases. The PCB 10 can be assembled using a range of different parts or components, including a PCB, integrated circuit devices mounted and electrically connected to the PCB, resistors, capacitors, inductors, RF splitters, RF couplers, connectors, and other components.

The PCB 10 includes a board core 12, which can be embodied by one or more layers of laminate core material. The board core 12 includes a top side or surface 12A, a bottom side or surface (not shown in FIG. 1), and a peripheral edge 12B. In one example described below, the PCB 10 also includes a first metal layer on the top surface 12A of the board core 12, a second metal layer on the bottom surface of the board core 12, and one or more internal metal layers positioned between the layers of laminate core material of the board core 12. In other examples, the PCB 10 can include fewer metal layers, such as metal layers on only one or both outer surfaces of the board core 12.

The board core 12 can have a dielectric constant based on the layers of laminate core material from which it is formed. In one example, the core material of the board core 12 can be a fiberglass-reinforced epoxy laminate material, such as FR4 or similar laminate core material. In other examples, the core material of board core 12 can be formed from other materials, such as ROGERS® 3450, 6010, 4003C, 4350B, or 4450B core materials, although others can be relied upon. A suitable thickness of the board core 12 can range, such as between and 40 mils (i.e., thousandths of an inch), although other thicknesses can be relied upon.

The PCB 10 also includes one or more metal layers formed on the outer surfaces of the board core 12 and, depending on the number of layers of the PCB 10, between the layers of the laminate core material of the board core 12. When formed, the metal layers can be patterned into metal traces. The metal traces serve as electrical interconnects between components on the PCB 10. A number of metal traces of one metal layer of the PCB 10 are illustrated in FIG. 1 on the top outer surface of the PCB 10. The metal traces include metal traces 14A-14K, among others, as described herein. The PCB 10 can also include additional metal traces of other metal layers formed between the layers of the laminate core material of the PCB 10, as well as on the bottom outer surface of the PCB 10.

A number of components are mounted and electrically connected to the PCB 10, including components 20-29, among others. The components 20-29 can include a range of active semiconductor devices, active semiconductor integrated circuits, passive electrical components, and other components in discrete and integrated packages of any format. The components 20-29 can also include board connectors and other components. For example, the components 20-25 can be embodied as packaged integrated circuits, such as integrated amplifiers, voltage and current drivers, controllers, digital or analog filters, digital step attenuators, switches, limiters, integrated optical devices, and other integrated circuits. The component 26 can be embodied as a connector, such as header with a number of pins, connectors, or other contacts for electrical connection with the PCB 10. The component 27 can be embodied as a passive electrical component, such one or more resistors, capacitors, inductors, couplers, or other electrical components. The components 28 and 29 can be embodied as other types of input and output connectors, such as radio frequency (RF) connectors of any suitable style, including Sub-Miniature (SMA), Sub-Miniature Version B (SMB), Bayonet Neill-Concelman (BNC), threaded BNC, DIN, or other styles of connectors typically used for RF signal connections. Overall, the PCB 10 is not limited to use with any particular types of components, and other components can be mounted and electrically connected to the PCB 10. In that sense, the operational and functional capabilities of the PCB 10 can range among the embodiments as described herein, and example functional capabilities of PCB boards are described herein with reference to FIGS. 2-4. The concepts are not limited to use with PCB boards having any particular capabilities, however.

As examples of connections that can be made to the PCB 10, one or more sources of power can be provided at the connector component 27, such as a 50V source of power for amplifiers on the PCB 10 and a low voltage 5V, 10V, or other source of power for control circuitry on the PCB 10. An input signal can be provided at the input connector component 28, and an output signal can be provided at the output connector component 29. The input signal can be switched, filtered, amplified, other otherwise processed and modified on the PCB 10 and provided as an output at the output connector component 29.

The components 20-29 are electrically connected to certain metal traces of the PCB 10, such as to the metal traces 14A-14K, among others. Metal traces of one metal layer can be electrically connected to metal traces of other metal layers of the PCB 10 using vias, such as the via 15, among others. Thus, the metal traces of the PCB 10 provide electrical connections among the components 20-29. As examples, the metal trace 14A provides an electrical connection from the input component 28 to the component 20, which can be an integrated circuit device. The metal trace 14C provides an electrical connection from the component 20 to the component 21, which can be another integrated circuit device. The metal trace 14D provides an electrical connection from the component 21 to the component 24, and the metal trace 14K provides an electrical connection from the component 24 to the connector component 24. Other metal traces on the PCB 10 provide other electrical connections among other components on the PCB 10.

The metal layers of the PCB 10 are not limited to metal traces for interconnections among the components 20-29, however. The metal layers of the PCB 10 can also include board reference indicator traces. Examples of the board reference indicator traces in FIG. 1 include the indicator traces 30-33, among others. The indicator traces 30-33 are formed as part of the same metal layer as the metal traces 14A-14K but are not relied upon for electrical connections among the components 20-29 on the PCB 10. Instead, the indicator traces 30-33 are electrically isolated from other metal traces on the PCB 10 and provide visual references to certain features on or of the PCB 10, such as circuit inputs, circuit outputs, component identifiers, and other references for individuals to use and operate the PCB 10.

The PCB 10 also includes one or more solder mask layers. A solder mask 50 is identified in FIG. 1 on the top outer surface of the PCB 10, and a similar solder mask can be applied to the bottom outer surface of the PCB 10. The solder mask 50 can be relied upon to protect the PCB 10 against oxidation, prevent unwanted solder bridges from forming between closely spaced solder pads. The solder mask 50 can be embodied as one or more thin layers of polymer or other coating, with or without pigments or other additives to add color and opacity, over certain areas on the top outer surface of the PCB 10. The solder mask 50 can also be applied over areas of the metal layer on the outer surface of the PCB 10, such as over lengths of the metal traces 14A-14K. Silkscreen, photolithography, or other techniques can be used to remove or omit the coating of the solder mask 50 from certain areas on the PCB 10. The coating of the solder mask 50 can be omitted, for example, where electrical contacts or pads are formed for soldered connections to the components 20-29 on the PCB 10, as understood in the field.

The solder mask 50 can include a pigment or coloring in the coating layers. Example pigments include, green, red, and blue, and other colors can be relied upon. The solder mask 50 can also include board mask reference indicators. Examples of the board mask reference indicators in FIG. 1 include the mask reference indicators 40 and 41, among possibly others. The mask reference indicators 40 and 41 provide references to certain features on or of the PCB 10, such as circuit inputs, circuit outputs, component identifiers or outlines, and other references for individuals to use and operate the PCB 10. As compared to the indicator traces 30-33, which are formed as metal traces, the mask reference indicators 40 and 41 are formed as a polymer or other coating layer of the solder mask 50, including a pigment or other additive to provide sufficient contrast for visibility. In some cases, the solder mask 50 can include a coating layer of a first color, such as dark green, red, or blue for application across the PCB 10, and another coating layer of a second color, such as white or yellow, for the mask reference indicators 40 and 41. The PCB 10 can also omit the mask reference indicators 40 and 41, omit the indicator traces 30-33, omit both the mask reference indicators 40 and 41 and the indicator traces 30-33, or omit certain ones of the reference indicators 40 and 41 and the indicator traces 30-33.

The PCB 10 also includes a board configuration block 60 within a region 62 of the top outer surface of the PCB 10. In other cases, the board configuration block 60 and other board configuration blocks described herein can be formed on the bottom outer surface of the PCB 10. The board configuration block 60 (also "configuration block 60") is provided as a representative example in FIG. 1, and other examples of configuration blocks are described below. The configuration block 60 can be located at any suitable position on the PCB 10, where sufficient open space on the board is available. In some cases, the board configuration blocks can be located on board edge scheme projections of PCBs, as described below with reference to the examples shown in FIGS. 5-8.

The configuration block 60 can include a plan diagram for the PCB 10, an operational diagram for the PCB 10, a combination of plan and operational diagrams for the PCB 10, and other features described herein. The configuration block 60 can be formed using metal traces of the metal layer on the top outer surface of the PCB 10. Plan diagrams of the configuration block 60 can include plan component traces, which are representative of and correspond to certain components on the PCB 10, such as one or more of the components 20-29. The plan diagram can also include plan reference traces which correspond to one or more of the indicator traces 30-33. The operational diagrams of the configuration block 60 can be representative of functional or operational characteristics of the PCB 10. Additional examples of plan diagrams, operational diagrams, and other features of the configuration block 60 and other configuration blocks are described below. In other cases, the configuration block 60 can be formed using the solder mask 50 rather than using metal traces of the metal layer on the top outer surface of the PCB 10. In that case, the configuration block 60 can be formed using plan component and plan reference mask features.

The solder mask 50 can be formed to highlight or identify the configuration block on the PCB 10. For example, the solder mask 50 can include a first pigment or color 51, such as blue, outside the region 62 for the configuration block 60 and a second pigment or color 52, such as red, inside the region 62. In that case, the configuration block 60 can be easily identified by the two different colors. In another example, the solder mask 50 can include a first pigment or color 51, such as blue, outside the region 62 and omit any pigment or color inside the region 62. In that case, the configuration block 60 can still be identified by the difference in colors between the mask 50 outside the region 62 and the intrinsic color of the laminate core material of the board core 12 inside the region 62.

As described herein, the configuration block 60 provides a number of details for the use and operation of the PCB 10, such as references for the components on the PCB 10, input connections for the PCB 10, output connections for the PCB 10, operational capabilities and functions of the PCB 10, and other information relied upon by individuals to operate the PCB 10 in one or more ways.

Figure 2:
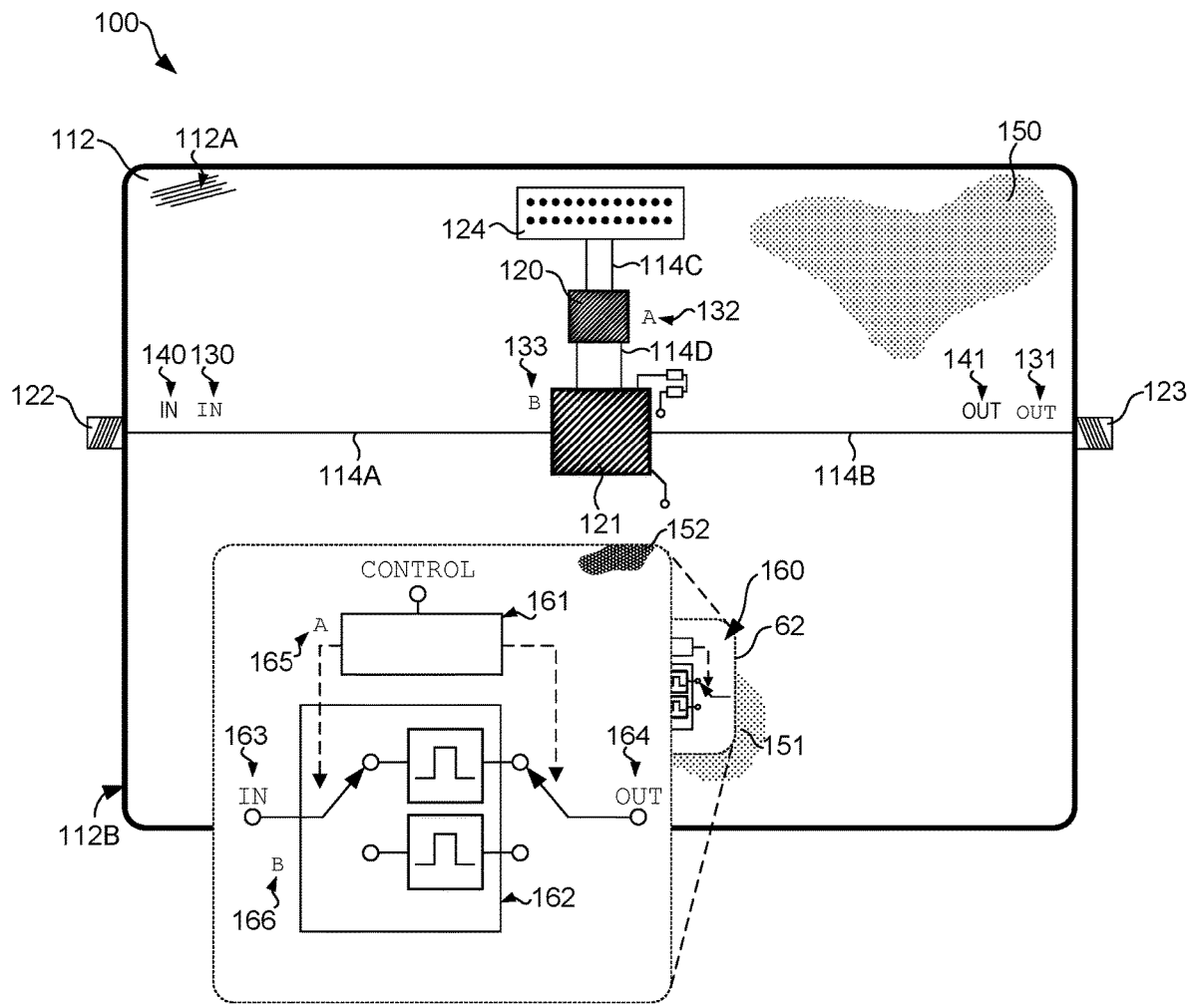
FIG. 2 illustrates another example PCB with another board configuration block according to various examples described herein.

FIG. 2 illustrates another example PCB 100 with another board configuration block 160 according to various examples described herein. Similar to the PCB 10, the PCB 100 includes a board core 112, which can be embodied by one or more layers of laminate core material. The board core 112 includes a top side or surface 112A, a bottom side or surface (not shown in FIG. 2), and a peripheral edge 112B. The PCB 100 also includes a first metal layer on the top surface 112A of the board core 112, a second metal layer on the bottom surface of the board core 112, and possibly one or more internal metal layers positioned between the layers of laminate core material of the board core 112. The core material of the board core 112 can be a fiberglass-reinforced epoxy laminate material, among others described herein and known in the field.

The PCB 100 also includes one or more metal layers formed on the outer surfaces of the board core 112 and between the layers of the laminate core material in some cases. When formed, the metal layers can be patterned into metal traces. The metal traces serve as electrical interconnects between components on the PCB 100. A number of metal traces of one metal layer of the PCB 100 are illustrated in FIG. 2 on the top outer surface of the PCB 100. The metal traces include metal traces 114A-114D, among others. The PCB 100 can also include additional metal traces of other metal layers formed between the layers of the laminate core material of the PCB 100, as well as on the bottom outer surface of the PCB 100.

A number of components are mounted and electrically connected to the PCB 100, including components 120-124, among others. The components 120-124 can include a range of active semiconductor devices, active semiconductor integrated circuits, passive electrical components, and other components in discrete and integrated packages of any format. The components 120-124 can also include board connectors and other components. For example, the components 120 and 121 can be embodied as packaged integrated circuits, such as controllers, digital or analog filters, switches, and other integrated circuits. The components 122 and 123 can be embodied as input and output RF connectors of any suitable style. The component 124 can be embodied as a connector, such as header with a number of pins, or other contacts for electrical connection with the PCB 100. The PCB 100 is not limited to use with any particular types of components, and other components can be mounted and electrically connected to the PCB 100. Thus, the PCB 100 is also not limited to any particular use or purpose, and the PCB 100 can be relied upon to process analog and digital control signals, data signals, mixed analog and digital signals, optical signals, RF signals, etc.

As examples of connections that can be made to the PCB 100, one or more sources of power can be provided at the connector component 124. An input signal can be provided at the input connector component 122, and an output signal can be provided at the output connector component 123. The input signal can be switched, filtered, amplified, other otherwise processed and modified on the PCB 100 and provided as an output at the output connector component 123.

The components 120-124 are electrically connected to certain metal traces of the PCB 100, such as to the metal traces 114A-114D, among others. Metal traces of one metal layer can be electrically connected to metal traces of other metal layers of the PCB 100 using vias. Thus, the metal traces of the PCB 100 provide electrical connections among the components 120-124. As examples, the metal trace 114A provides an electrical connection from the input component 122 to the component 121, which can be an integrated switched filter component. The metal trace 114B provides an electrical connection from the integrated switched filter component 121 to the output component 123. The metal trace 114C provides an electrical connection from the connector component 124 to the component 120, which can be an integrated controller circuit component. The metal trace 114D provides an electrical connection from the integrated controller circuit component 120 to the integrated switched filter component 121. Other metal traces on the PCB 100 provide other electrical connections among other components on the PCB 100.

The metal layers of the PCB 100 are not limited to metal traces for interconnections among the components 120-124, however. The metal layers of the PCB 100 can also include board reference indicator traces. Examples of the board reference indicator traces in FIG. 2 include the indicator traces 130-133, among others. The indicator traces 130-133 are formed as part of the same metal layer as the metal traces 114A-114D but are not relied upon for electrical connections among the components 120-124 on the PCB 100. Instead, the indicator traces 130-133 are electrically isolated from other metal traces on the PCB 100 and provide visual references to certain features on or of the PCB 100, such as circuit inputs, circuit outputs, component identifiers, and other references for individuals to use and operate the PCB 100.

The PCB 100 also includes one or more solder mask layers. A solder mask 150 is identified in FIG. 2 on the top outer surface of the PCB 100, and a similar solder mask can be applied to the bottom outer surface of the PCB 100. The solder mask 150 can be relied upon to protect the PCB 100 against oxidation, prevent unwanted solder bridges from forming between closely spaced solder pads. The solder mask 150 can be embodied as one or more thin layers of polymer or other coating, with or without pigments or other additives to add color and opacity, over certain areas on the top outer surface of the PCB 100. The solder mask 150 can also be applied over areas of the metal layer on the outer surface of the PCB 100, such as over lengths of the metal traces 114A-114D. Silkscreen, photolithography, or other techniques can be used to remove or omit the coating of the solder mask 150 from certain areas on the PCB 100. The coating of the solder mask 150 can be omitted, for example, where electrical contacts or pads are formed for soldered connections to the components 120-124 on the PCB 100, as understood in the field.

The solder mask 150 can include a pigment or coloring in the coating layers. Example pigments include, green, red, and blue, and other colors can be relied upon. The solder mask 150 can also include board mask reference indicators. Examples of the board mask reference indicators in FIG. 2 include the mask reference indicators 140 and 141, among possibly others. The mask reference indicators 140 and 141 provide references to certain features on or of the PCB 100, such as circuit inputs, circuit outputs, component identifiers or outlines, and other references for individuals to use and operate the PCB 100. As compared to the indicator traces 130-133, which are formed as metal traces, the mask reference indicators 140 and 141 are formed as a polymer or other coating layer of the solder mask 150, including a pigment or other additive to provide sufficient contrast for visibility. In some cases, the solder mask 150 can include a coating layer of a first color, such as dark green, red, or blue for application across the PCB 100, and another coating layer of a second color, such as white or yellow, for the mask reference indicators 140 and 141.

The PCB 100 also includes a board configuration block 160 within a region 62 of the top outer surface of the PCB 100. The board configuration block 160 (also "configuration block 160") is provided as a representative example in FIG. 2, and other examples of configuration blocks are described below. An expanded or exploded view of the configuration block 160 is shown in FIG. 2. The configuration block 160 can be located at any suitable position on the PCB 100, where sufficient open space on the board is available. In some cases, the board configuration blocks can be located on board edge scheme projections of PCBs, as described below with reference to the examples shown in FIGS. 5-8.

The configuration block 160 can include a plan diagram for the PCB 100, an operational diagram for the PCB 100, a combination of plan and operational diagrams for the PCB 100, and other features described herein. The configuration block 160 can be formed using metal traces of the metal layer on the top outer surface of the PCB 100. Plan diagrams of the configuration block 160 can include plan component traces, which are representative of and correspond to certain components on the PCB 100, such as one or more of the components 120-123. Plan component traces 161 and 162 are shown in FIG. 2 as examples. The plan component traces 161 and 162 can correspond to the components 120 and 121 on the PCB 100, respectively, and relative positions of the plan component traces 161 and 162 in the plan diagram correspond to relative positions of the components 120 and 121 on the PCB 100.

Plan diagrams of the configuration block 160 can also include plan reference traces. Plan reference traces 163-166 are shown in FIG. 2 as examples, although the plan reference traces 163-166 can be omitted from the plan diagrams of the configuration block 160 in some cases. The plan reference traces 163-166 can correspond to the indicator traces 130-133 on the PCB 100, respectively. In the example shown, the plan reference trace 163 corresponds to the indicator trace 130 on the PCB 100. The plan reference trace 164 corresponds to the indicator trace 131 on the PCB 100. The plan reference trace 165 corresponds to the indicator trace 132 on the PCB 100. Additionally, the plan reference trace 166 corresponds to the indicator trace 133 on the PCB 100.

The PCB 100 can also omit some or all of the indicator traces 130-133 outside the region 62 of the board configuration block 160. In that case, one or more of the plan reference traces 163-166 of the board configuration block 160 can correspond to certain mask reference indicators of the solder mask 150. For example, the plan reference trace 163 can correspond to the mask reference indicator 140. Similarly, the plan reference trace 164 can correspond to the mask reference indicator 141.

In other cases, the configuration block 160 can be formed using the solder mask 150 rather than using metal traces of the metal layer on the top outer surface of the PCB 100. In that case, the configuration block 160 can be formed using plan component and plan reference mask indicators of the solder mask 150 in white or yellow pigment. For example, the plan component traces 161 and 162 can be formed using white plan component mask indicators of the solder mask 150. Similarly, the plan reference traces 163-166 can be formed using white plan reference mask indicators of the solder mask 150.

The solder mask 150 can be formed to highlight or identify the configuration block 160 on the PCB 100. For example, the solder mask 150 can include a first pigment or color 151, such as blue, outside the region 62 for the configuration block 160 and a second pigment or color 152, such as red, inside the region 62. In that case, the configuration block 160 can be easily identified by the two different colors. In another example, the solder mask 150 can include a first pigment or color 151, such as blue, outside the region 62 and omit any pigment or color inside the region 62. In that case, the configuration block 160 can still be identified by the difference in colors between the mask 150 outside the region 62 and the intrinsic color of the laminate core material of the board core 112 inside the region 62.

As described herein, the configuration block 160 provides a number of details for the use and operation of the PCB 100, such as references to and relative locations of the components on the PCB 100, input connections for the PCB 100, output connections for the PCB 100, operational capabilities and functions of the PCB 100, and other information relied upon by individuals to operate the PCB 100 in one or more ways.

Figure 3:
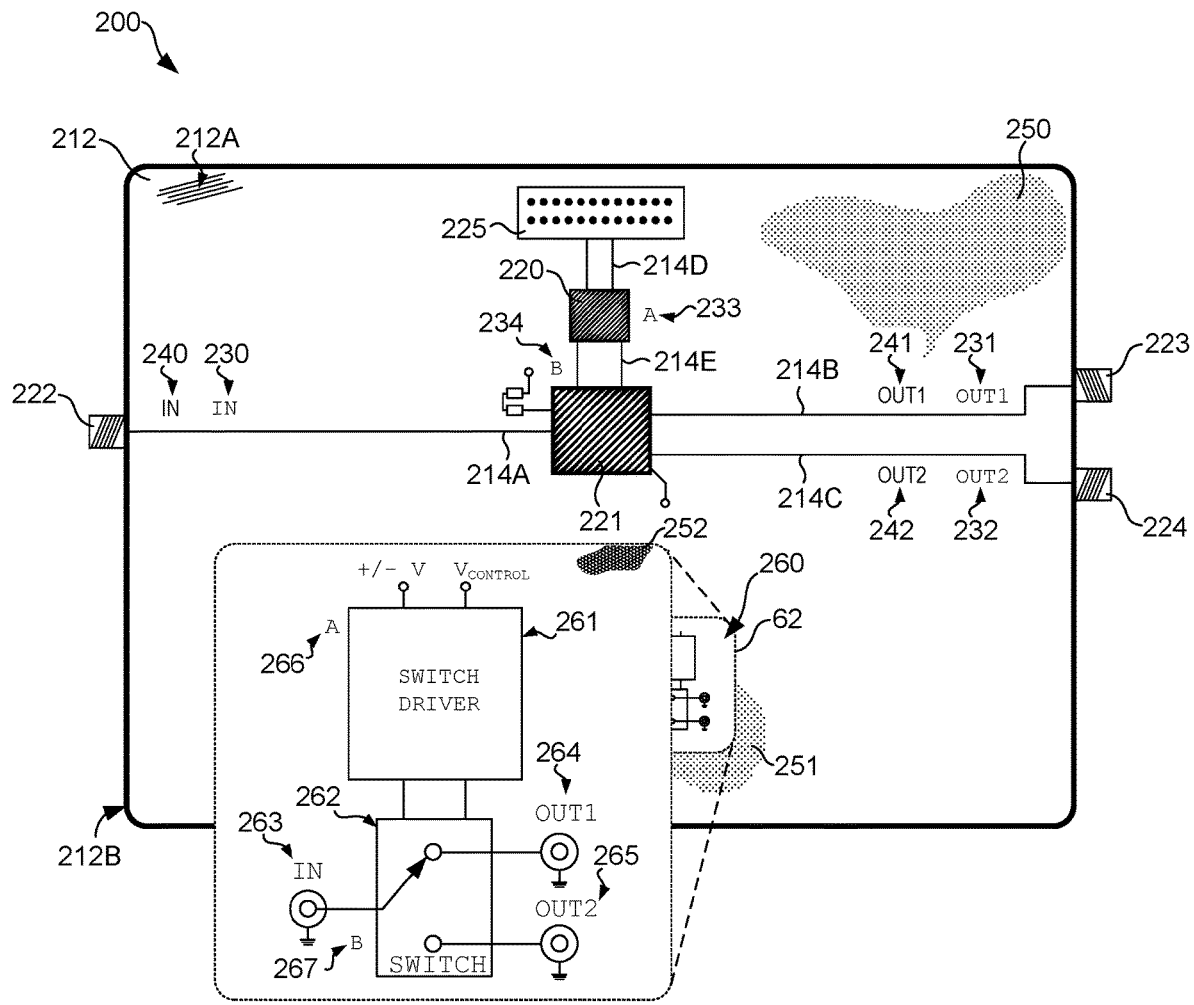
FIG. 3 illustrates another example PCB with another board configuration block according to various examples described herein.

FIG. 3 illustrates another example PCB 200 with another board configuration block 260 according to various examples described herein. Similar to the PCB 10 shown in FIG. 1, the PCB 200 includes a board core 212, which can be embodied by one or more layers of laminate core material. The board core 212 includes a top side or surface 212A, a bottom side or surface (not shown in FIG. 3), and a peripheral edge 212B. The PCB 200 also includes a first metal layer on the top surface 212A of the board core 212, a second metal layer on the bottom surface of the board core 212, and possibly one or more internal metal layers positioned between the layers of laminate core material of the board core 212. The core material of the board core 212 can be a fiberglass-reinforced epoxy laminate material, among others described herein and known in the field.

The PCB 200 also includes one or more metal layers formed on the outer surfaces of the board core 212 and between the layers of the laminate core material in some cases. When formed, the metal layers can be patterned into metal traces. The metal traces serve as electrical interconnects between components on the PCB 200. A number of metal traces of one metal layer of the PCB 200 are illustrated in FIG. 3 on the top outer surface of the PCB 200. The metal traces include metal traces 214A-214E, among others. The PCB 200 can also include additional metal traces of other metal layers formed between the layers of the laminate core material of the PCB 200, as well as on the bottom outer surface of the PCB 200.

A number of components are mounted and electrically connected to the PCB 200, including components 220-225, among others. The components 220-225 can include a range of active semiconductor devices, active semiconductor integrated circuits, passive electrical components, and other components in discrete and integrated packages of any format. The components 220-225 can also include board connectors and other components. For example, the components 220 and 221 can be embodied as packaged integrated circuits, such as controllers, switches, and other integrated circuits. The components 222, 223, and 224 can be embodied as input and output RF connectors of any suitable style. The component 225 can be embodied as a connector, such as header with a number of pins, or other contacts for electrical connection with the PCB 200. Overall, the PCB 200 is not limited to use with any particular types of components, and other components can be mounted and electrically connected to the PCB 200.

As examples of connections that can be made to the PCB 200, one or more sources of power can be provided at the connector component 225. An input signal can be provided at the input connector component 222, and output signals can be provided at the output connector components 223 and 224. The input signal can be switched, filtered, amplified, other otherwise processed and modified on the PCB 200 and provided as an output at the output connector component 223 or the output connector component 224.

The components 220-225 are electrically connected to certain metal traces of the PCB 200, such as to the metal traces 214A-214E, among others. Metal traces of one metal layer can be electrically connected to metal traces of other metal layers of the PCB 200 using vias. Thus, the metal traces of the PCB 200 provide electrical connections among the components 220-225. As examples, the metal trace 214A provides an electrical connection from the input component 222 to the component 221, which can be an integrated switch component. The metal trace 214B provides an electrical connection from the integrated switched component 221 to the first output component 223. The metal trace 214C provides an electrical connection from the integrated switched component 221 to the second output component 224. The metal trace 214D provides an electrical connection from the connector component 224 to the component 220, which can be an integrated switch driver component. The metal trace 214E provides an electrical connection from the integrated switch driver component 220 to the integrated switch component 221. Other metal traces on the PCB 200 provide other electrical connections among other components on the PCB 200.

The metal layers of the PCB 100 are not limited to metal traces for interconnections among the components 220-225, however. The metal layers of the PCB 200 can also include board reference indicator traces. Examples of the board reference indicator traces in FIG. 3 include the indicator traces 230-234, among others. The indicator traces 230-234 are formed as part of the same metal layer as the metal traces 214A-214E but are not relied upon for electrical connections among the components 220-225 on the PCB 200. Instead, the indicator traces 230-234 are electrically isolated from other metal traces on the PCB 200 and provide visual references to certain features on or of the PCB 200, such as circuit inputs, circuit outputs, component identifiers, and other references for individuals to use and operate the PCB 200.

The PCB 200 also includes one or more solder mask layers. A solder mask 250 is identified in FIG. 3 on the top outer surface of the PCB 200, and a similar solder mask can be applied to the bottom outer surface of the PCB 200. The solder mask 250 can be relied upon to protect the PCB 200 against oxidation, prevent unwanted solder bridges from forming between closely spaced solder pads. The solder mask 250 can be embodied as one or more thin layers of polymer or other coating, with or without pigments or other additives to add color and opacity, over certain areas on the top outer surface of the PCB 200. The solder mask 250 can also be applied over areas of the metal layer on the outer surface of the PCB 200, such as over lengths of the metal traces 214A-214E. Silkscreen, photolithography, or other techniques can be used to remove or omit the coating of the solder mask 250 from certain areas on the PCB 200. The coating of the solder mask 250 can be omitted, for example, where electrical contacts or pads are formed for soldered connections to the components 220-225 on the PCB 200, as understood in the field.

The solder mask 250 can include a pigment or coloring in the coating layers. Example pigments include, green, red, and blue, and other colors can be relied upon. The solder mask 250 can also include board mask reference indicators. Examples of the board mask reference indicators in FIG. 3 include the mask reference indicators 240-242, among possibly others. The mask reference indicators 240-242 provide references to certain features on or of the PCB 200, such as circuit inputs, circuit outputs, component identifiers or outlines, and other references for individuals to use and operate the PCB 200. As compared to the indicator traces 230-234, which are formed as metal traces, the mask reference indicators 240-242 are formed as a polymer or other coating layer of the solder mask 250, including a pigment or other additive to provide sufficient contrast for visibility. In some cases, the solder mask 250 can include a coating layer of a first color, such as dark green, red, or blue for application across the PCB 200, and another coating layer of a second color, such as white or yellow, for the mask reference indicators 240-242.

The PCB 200 also includes a board configuration block 260 within a region 62 of the top outer surface of the PCB 200. The board configuration block 260 (also "configuration block 260") is provided as a representative example in FIG. 3, and other examples of configuration blocks are described herein. An expanded or exploded view of the configuration block 260 is shown in FIG. 3. The configuration block 260 can be located at any suitable position on the PCB 200, where sufficient open space on the board is available. In some cases, the board configuration blocks can be located on board edge scheme projections of PCBs, as described below with reference to the examples shown in FIGS. 5-8.

The configuration block 260 can include a plan diagram for the PCB 200, an operational diagram for the PCB 200, a combination of plan and operational diagrams for the PCB 200, and other features described herein. The configuration block 260 can be formed using metal traces of the metal layer on the top outer surface of the PCB 200. Plan diagrams of the configuration block 260 can include plan component traces, which are representative of and correspond to certain components on the PCB 200, such as one or more of the components 220-225. Plan component traces 261 and 262 are shown in FIG. 2 as examples. The plan component traces 261 and 262 can correspond to the components 220 and 221 on the PCB 200, respectively, and relative positions of the plan component traces 261 and 262 in the plan diagram correspond to relative positions of the components 220 and 221 on the PCB 200.

Plan diagrams of the configuration block 260 can also include plan reference traces. Plan reference traces 263-267 are shown in FIG. 3 as examples, although the plan reference traces 263-267 can be omitted from the plan diagrams of the configuration block 260 in some cases. The plan reference traces 263-267 can correspond to the indicator traces 230-234 on the PCB 200, respectively. In the example shown, the plan reference trace 263 corresponds to the indicator trace 230 on the PCB 200. The plan reference trace 264 corresponds to the indicator trace 231 on the PCB 200. The plan reference trace 265 corresponds to the indicator trace 232 on the PCB 200. The plan reference trace 266 corresponds to the indicator trace 233 on the PCB 200. Additionally, the plan reference trace 267 corresponds to the indicator trace 234 on the PCB 200.

The PCB 200 can also omit some or all of the indicator traces 230-234 outside the region 62 of the board configuration block 260. In that case, one or more of the plan reference traces 263-267 of the board configuration block 260 can correspond to certain mask reference indicators of the solder mask 250. For example, the plan reference trace 263 can correspond to the mask reference indicator 240. Similarly, the plan reference trace 264 can correspond to the mask reference indicator 241, and the plan reference trace 265 can correspond to the mask reference indicator 242.

In other cases, the configuration block 260 can be formed using the solder mask 250 rather than using metal traces of the metal layer on the top outer surface of the PCB 200. In that case, the configuration block 260 can be formed using plan component and plan reference mask indicators of the solder mask 250 in white or yellow pigment. For example, the plan component traces 261 and 262 can be formed using white plan component mask indicators of the solder mask 250. Similarly, the plan reference traces 263-267 can be formed using white plan reference mask indicators of the solder mask 250.

The solder mask 250 can be formed to highlight or identify the configuration block 260 on the PCB 200. For example, the solder mask 250 can include a first pigment or color 251, such as blue, outside the region 62 for the configuration block 260 and a second pigment or color 252, such as red, inside the region 62. In that case, the configuration block 260 can be easily identified by the two different colors. In another example, the solder mask 250 can include a first pigment or color 251, such as blue, outside the region 62 and omit any pigment or color inside the region 62. In that case, the configuration block 260 can still be identified by the difference in colors between the mask 250 outside the region 62 and the intrinsic color of the laminate core material of the board core 212 inside the region 62.

As described herein, the configuration block 260 provides a number of details for the use and operation of the PCB 200, such as references to and relative locations of the components on the PCB 200, input connections for the PCB 200, output connections for the PCB 200, operational capabilities and functions of the PCB 200, and other information relied upon by individuals to operate the PCB 200 in one or more ways.

Figure 4:
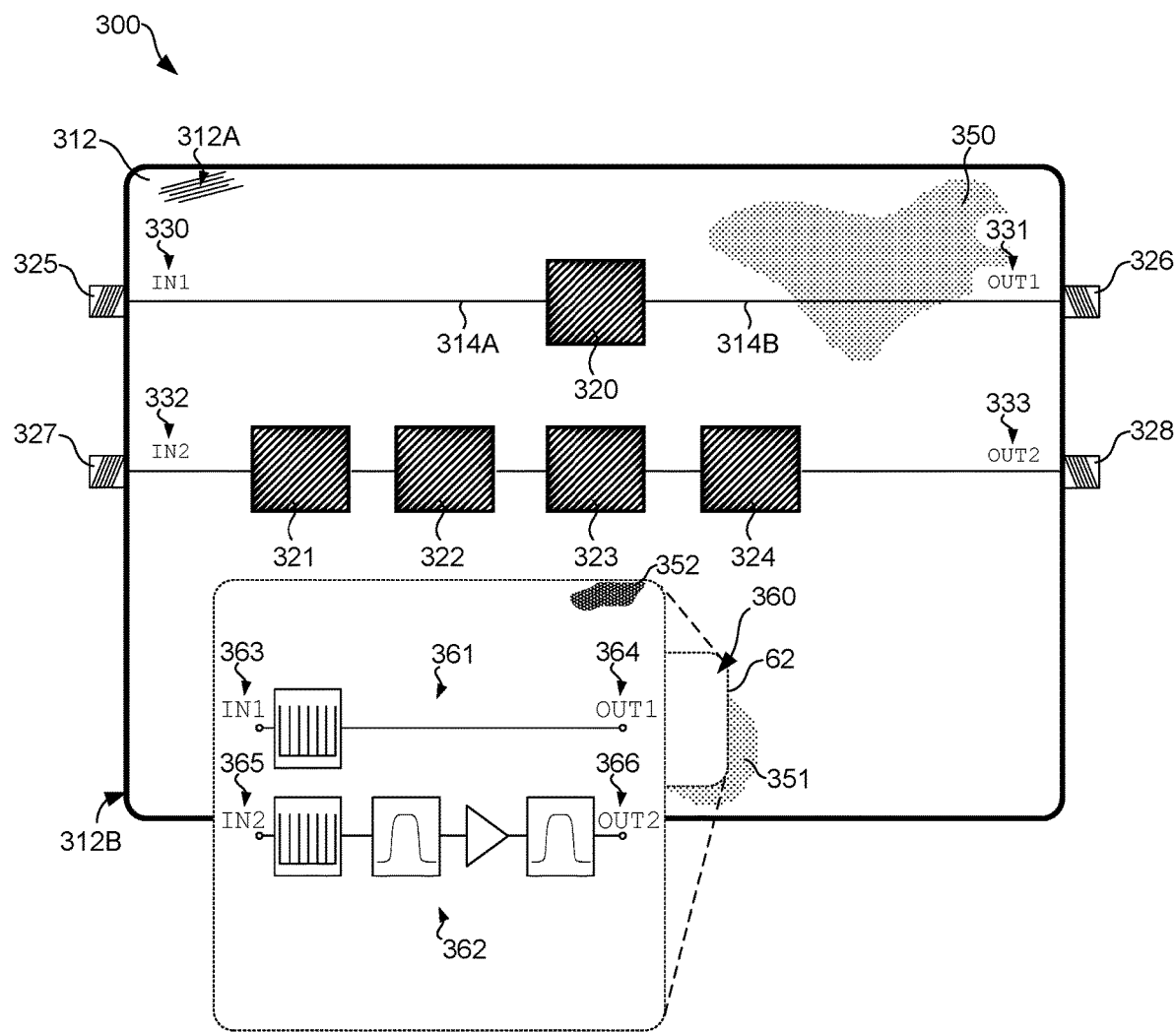
FIG. 4 illustrates another example PCB with another board configuration block according to various examples described herein.

FIG. 4 illustrates another example PCB 300 with another board configuration block 360 according to various examples described herein. Similar to the PCB 10 shown in FIG. 1, the PCB 300 includes a board core 312, which can be embodied by one or more layers of laminate core material. The board core 312 includes a top side or surface 312A, a bottom side or surface (not shown in FIG. 4), and a peripheral edge 312B. The PCB 300 also includes a first metal layer on the top surface 312A of the board core 312, a second metal layer on the bottom surface of the board core 312, and possibly one or more internal metal layers positioned between the layers of laminate core material of the board core 312. The core material of the board core 312 can be a fiberglass-reinforced epoxy laminate material, among others described herein and known in the field.

The PCB 300 also includes one or more metal layers formed on the outer surfaces of the board core 312 and between the layers of the laminate core material in some cases. When formed, the metal layers can be patterned into metal traces. The metal traces serve as electrical interconnects between components on the PCB 300. A number of metal traces of one metal layer of the PCB 300 are illustrated in FIG. 4 on the top outer surface of the PCB 300. The metal traces include metal traces 314A and 314B, among others. The PCB 300 can also include additional metal traces of other metal layers formed between the layers of the laminate core material of the PCB 300, as well as on the bottom outer surface of the PCB 300.

A number of components are mounted and electrically connected to the PCB 300, including components 320-328 among others. The components 320-328 can include a range of active semiconductor devices, active semiconductor integrated circuits, passive electrical components, and other components in discrete and integrated packages of any format. The components 320-328 can also include board connectors and other components. As examples, the components 320-324 can be embodied as packaged integrated, such as comb filters, bandpass and band stop filters, amplifiers, other integrated circuits. The components 325-328 can be embodied as input and output RF connectors of any suitable style. Overall, the PCB 300 is not limited to use with any particular types of components, and other components can be mounted and electrically connected to the PCB 300.

An input signal can be provided at the input connector components 325 and 327, and output signals can be provided at the output connector components 326 and 328. The input signals can be filtered amplified other otherwise processed and modified on the PCB 300 and provided as output signals at the output connector components 326 and 328. Two different signal processing chains are provided on the PCB 300, with one provided between the connectors 325 and 326 and another provided between the connectors 327 and 328.

The components 320-328 are electrically connected to certain metal traces of the PCB 300, such as to the metal traces 314A and 314B, among others. Metal traces of one metal layer can be electrically connected to metal traces of other metal layers of the PCB 300 using vias. Thus, the metal traces of the PCB 300 provide electrical connections among the components 320-328. As examples, the metal trace 314A provides an electrical connection from the input component 325 to the component 320, and the metal trace 314B provides an electrical connection from the component 320 to the output component 236. Other metal traces on the PCB 300 provide other electrical connections among other components on the PCB 300.

As in other examples described herein, the metal layers of the PCB 300 are not limited to metal traces for interconnections among the components 320-328. The metal layers of the PCB 300 can also include board reference indicator traces. Examples of the board reference indicator traces in FIG. 3 include the indicator traces 330-333, among others. The indicator traces 330-333 are formed as part of the same metal layer as the metal traces 314A and 314B but are not relied upon for electrical connections among the components 320-328 on the PCB 300. Instead, the indicator traces 330-333 are electrically isolated from other metal traces on the PCB 300 and provide visual references to certain features on or of the PCB 300.

The PCB 300 also includes one or more solder mask layers. A solder mask 350 is identified in FIG. 4 on the top outer surface of the PCB 300, and a similar solder mask can be applied to the bottom outer surface of the PCB 300. The solder mask 350 can be relied upon to protect the PCB 300 against oxidation, prevent unwanted solder bridges from forming between closely spaced solder pads. The solder mask 350 can include a pigment or coloring in the coating layers. Example pigments include, green, red, and blue, and other colors can be relied upon. The solder mask 350 can also include board mask reference indicators, similar to the other examples described herein.

The PCB 300 also includes a board configuration block 360 within a region 62 of the top outer surface of the PCB 300. The board configuration block 360 (also "configuration block 360") is provided as a representative example in FIG. 3, and other examples of configuration blocks are described herein. An expanded or exploded view of the configuration block 360 is shown in FIG. 4. The configuration block 360 can be located at any suitable position on the PCB 300, where sufficient open space on the board is available. In some cases, the board configuration blocks can be located on board edge scheme projections of PCBs, as described below with reference to the examples shown in FIGS. 5-8.

The configuration block 360 can include a plan diagram for the PCB 300, an operational diagram for the PCB 300, a combination of plan and operational diagrams for the PCB 300, and other features described herein. The configuration block 360 can be formed using metal traces of the metal layer on the top outer surface of the PCB 300. Operational diagrams of the configuration block 360 can include operational traces, which are representative of the operations or functions supported by components on the PCB 300, such as one or more of the components 320-328. As examples, the operational traces 361 are representative of operations or functions supported by one signal chain of the PCB 300, and the operational traces 362 are representative of the operations or functions supported by another signal chain of the PCB 300

Operational diagrams of the configuration block 360 can also include plan reference traces. Plan reference traces 363-366 are shown in FIG. 4 as examples, although the plan reference traces 363-366 can be omitted from the plan diagrams of the configuration block 360 in some cases. The plan reference traces 363-366 can correspond to the indicator traces 330-333 on the PCB 300, respectively. In the example shown, the plan reference trace 363 corresponds to the indicator trace 330 on the PCB 300. The plan reference trace 364 corresponds to the indicator trace 331 on the PCB 300. The plan reference trace 365 corresponds to the indicator trace 332 on the PCB 300. The plan reference trace 366 corresponds to the indicator trace 333 on the PCB 300. The PCB 300 can also omit some or all of the indicator traces 330-233 outside the region 62 of the board configuration block 360. In that case, one or more of the plan reference traces 363-366 of the board configuration block 360 can correspond to certain mask reference indicators of the solder mask 350 (not shown in FIG. 4).

In other cases, the configuration block 360 can be formed using the solder mask 350 rather than using metal traces of the metal layer on the top outer surface of the PCB 300. In that case, the configuration block 360 can be formed using plan component and plan reference mask indicators of the solder mask 350 in white or yellow pigment. For example, the operational traces 361 and 326 can be formed using white plan component mask indicators of the solder mask 350. Similarly, the plan reference traces 363-266 can be formed using white plan reference mask indicators of the solder mask 350.

The solder mask 350 can be formed to highlight or identify the configuration block 360 on the PCB 300. For example, the solder mask 350 can include a first pigment or color 351, such as blue, outside the region 62 for the configuration block 360 and a second pigment or color 352, such as red, inside the region 62. In that case, the configuration block 360 can be easily identified by the two different colors. In another example, the solder mask 350 can include a first pigment or color 351, such as blue, outside the region 62 and omit any pigment or color inside the region 62. In that case, the configuration block 360 can still be identified by the difference in colors between the solder mask 350 outside the region 62 and the intrinsic color of the laminate core material of the board core 312 inside the region 62.

As described herein, the configuration block 360 provides a number of details for the use and operation of the PCB 300, such as references to and relative locations of the components on the PCB 300, input connections for the PCB 300, output connections for the PCB 300, operational capabilities and functions of the PCB 300, and other information relied upon by individuals to operate the PCB 300 in one or more ways.

Figure 5:
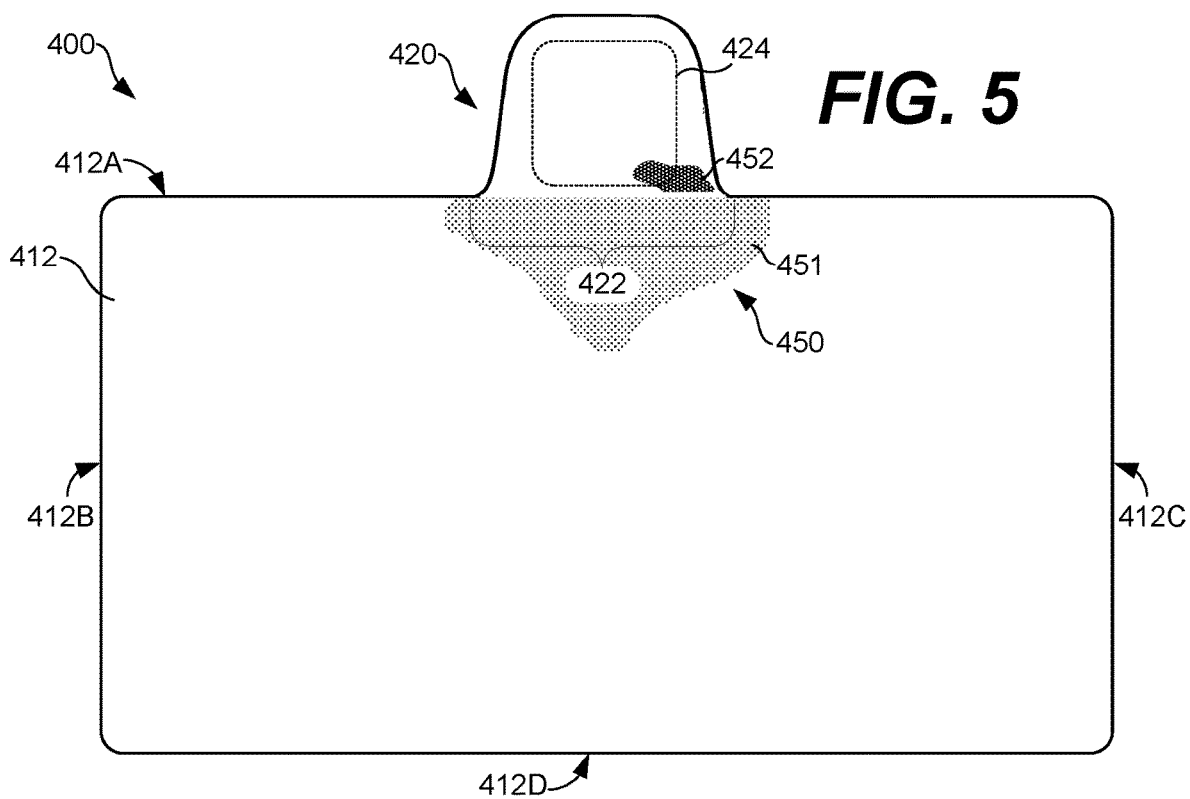
FIG. 5 illustrates another example PCB with an edge scheme projection according to various examples described herein.

FIG. 5 illustrates another example PCB 400 with a board edge scheme projection 420 (also "scheme projection") according to various examples described herein. The PCB 400 is provided as a representative example. The PCB 400 and the scheme projection 420 can be formed to other sizes and shapes as compared to that shown. Similar to the other PCBs described herein, the PCB 400 includes a board core embodied by one or more layers of core material. The board core includes a top side or surface, a bottom side or surface (not shown in FIG. 5), and a peripheral edge. The peripheral edge includes edges 412A-412D. Although the PCB 400 is shown as a type of rectangle in FIG. 5, the PCB 400 can be formed in other shapes, such as a square or other parallelogram. The PCB 400 can also be formed to have other numbers of edges, to include rounded corners or sides, and in other shapes. The PCB 400 can include metal layers on outer surfaces and between layers of the board core, similar to the other PCBs described herein. The PCB 400 can also include components mounted and electrically coupled to metal traces on the PCB 400, solder masks, and other features similar to the other PCBs described herein.

The scheme projection 420 projects out and off from the top side edge 412A of the PCB 400 over a projection edge region 422 of the top side edge 412A. The scheme projection 420 can also project off from another region of the top side edge 412A, such as closer to the right side edge 412B or the left side edge 412C. The scheme projection 420 can also be formed on other sides of the PCB 400 in other cases. For example, the scheme projection 420 can be formed on the right side edge 412B, the left side edge 412C, or the bottom side edge 412D of the PCB 400.

In one aspect of the embodiments, the projection shape of the scheme projection 420 can be based on an operational characteristic or functionality of components on the PCB 400. In the example shown, the shape of the scheme projection 420 is similar to that of an operational diagram for a passband filter, as would be recognized in the field of signal processing. Thus, one operational characteristic or functionality of the PCB 400 can be to act as a passband filter for RF signals, and the scheme projection 420 can be representative of other operational characteristics or functionalities, including other analog, digital, and optical functions of the PCB 400.

The scheme projection 420 can include a region 424, and a board configuration block can be positioned within the region 424. As examples, the board configuration blocks 160, 260, or 360, as described above and illustrated in FIGS. 1-4, can be positioned within the region 424. In other cases, the scheme projection 420 can be free from any board configuration block or other notations.

The PCB 400 also includes one or more solder mask layers. A solder mask 450 is identified in FIG. 5 on the top outer surface of the PCB 400, and a similar solder mask can be applied to the bottom outer surface of the PCB 400. Similar to the other solder masks described herein, the solder mask 450 can be embodied as one or more thin layers of polymer or other coating, with or without pigments or other additives to add color and opacity, over certain areas on the top outer surface of the PCB 400. The solder mask 450 can include a pigment or coloring in the coating layers. Example pigments include, green, red, and blue, and other colors can be relied upon.

In some cases, the solder mask 450 can highlight or identify the scheme projection 420 of the PCB 400. For example, the solder mask 450 can include a first pigment or color 451, such as blue, outside the scheme projection 420 and a second pigment or color 452, such as red, in the scheme projection 420. In that case, the scheme projection 420 can be easily identified by the two different colors. In another example, the solder mask 450 can include a first pigment or color 451, such as blue, outside the scheme projection 420 and omit any pigment or color in the scheme projection 420. In that case, the scheme projection 420 can still be identified by the difference in colors between the solder mask 450 outside the scheme projection 420 and the intrinsic color of the laminate core material of the PCB 400 in the scheme projection 420.

Figure 6:
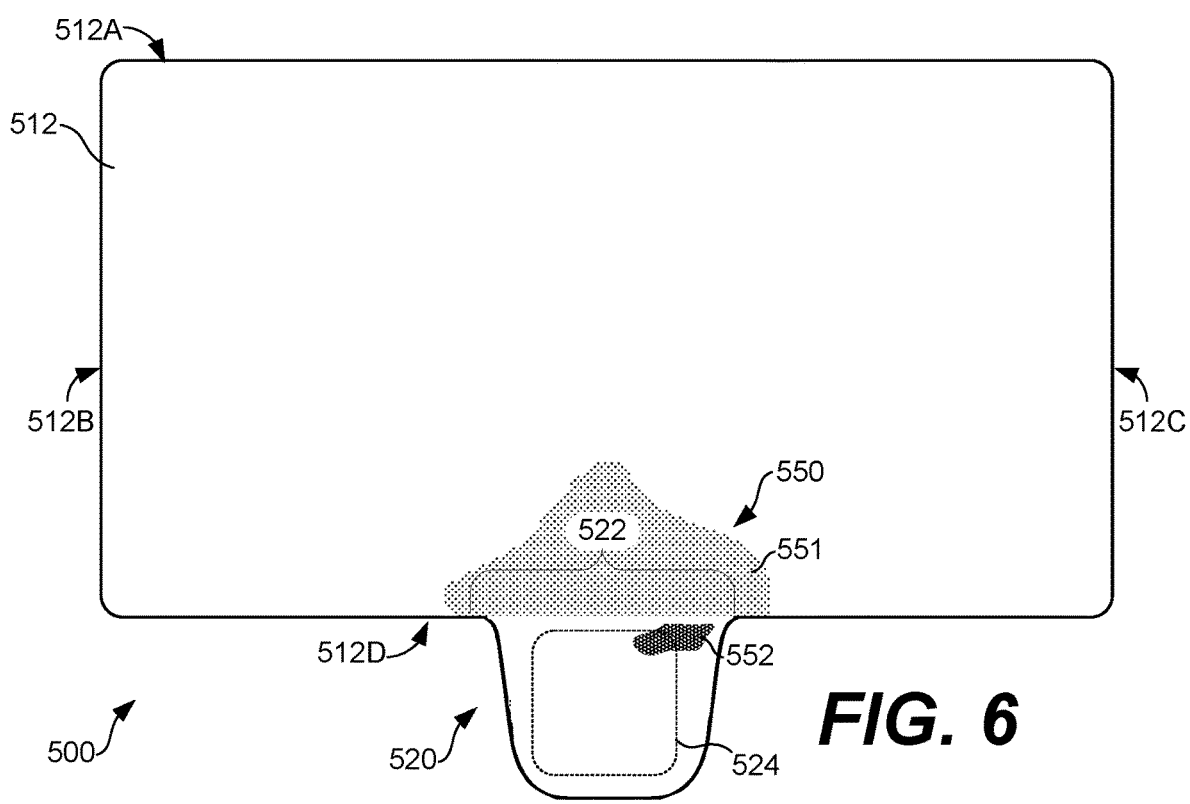
FIG. 6 illustrates another example PCB with another edge scheme projection according to various examples described herein.

FIG. 6 illustrates another example PCB with another scheme projection 520 according to various examples described herein. The PCB 500 and the scheme projection 520 can be formed to other sizes and shapes as compared to that shown. Similar to the other PCBs described herein, the PCB 500 includes a board core embodied by one or more layers of core material. The board core includes a top side or surface, a bottom side or surface (not shown in FIG. 6), and a peripheral edge. The peripheral edge includes edges 512A-512D. Although the PCB 500 is shown as a type of rectangle in FIG. 6, the PCB 500 can be formed in other shapes. The PCB 500 can include metal layers on outer surfaces and between layers of the board core, similar to the other PCBs described herein. The PCB 500 can also include components mounted and electrically coupled to metal traces on the PCB 500, solder masks, and other features similar to the other PCBs described herein.

The scheme projection 520 projects out and off from the bottom side edge 512D of the PCB 500 over a projection edge region 522 of the bottom side edge 512D. The scheme projection 520 can be formed on other sides of the PCB 500 in other cases. For example, the scheme projection 520 can be formed on the right side edge 512B, the left side edge 512C, or the top side edge 512A of the PCB 500.

In one aspect of the embodiments, the projection shape of the scheme projection 520 can be based on an operational characteristic or functionality of components on the PCB 500. In the example shown, the shape of the scheme projection 520 is similar to that of an operational diagram for a band stop filter, as would be recognized in the field of signal processing. Thus, one operational characteristic or functionality of the PCB 500 can be to act as a band stop filter for RF signals, and the scheme projection 520 can be representative of other operational characteristics or functionalities.

The scheme projection 520 can include a region 524, and a board configuration block can be positioned within the region 524. As examples, the board configuration blocks 160, 260, or 360, as described above and illustrated in FIGS. 1-4, can be positioned within the region 524. In other cases, the scheme projection 520 can be free from any board configuration block or other notations.

The PCB 500 also includes one or more solder mask layers. A solder mask 550 is identified in FIG. 6 on the top outer surface of the PCB 500, and a similar solder mask can be applied to the bottom outer surface of the PCB 500. Similar to the other solder masks described herein, the solder mask 550 can be embodied as one or more thin layers of polymer or other coating, with or without pigments or other additives to add color and opacity, over certain areas on the top outer surface of the PCB 500. The solder mask 550 can include a pigment or coloring in the coating layers. Example pigments include, green, red, and blue, and other colors can be relied upon.

In some cases, the solder mask 550 can highlight or identify the scheme projection 520 of the PCB 500. For example, the solder mask 550 can include a first pigment or color 551, such as blue, outside the scheme projection 520 and a second pigment or color 552, such as red, in the scheme projection 520. In that case, the scheme projection 520 can be easily identified by the two different colors. In another example, the solder mask 550 can include a first pigment or color 551, such as blue, outside the scheme projection 520 and omit any pigment or color in the scheme projection 520. In that case, the scheme projection 520 can still be identified by the difference in colors between the solder mask 550 outside the scheme projection 520 and the intrinsic color of the laminate core material of the PCB 500 in the scheme projection 520.

Figure 7:
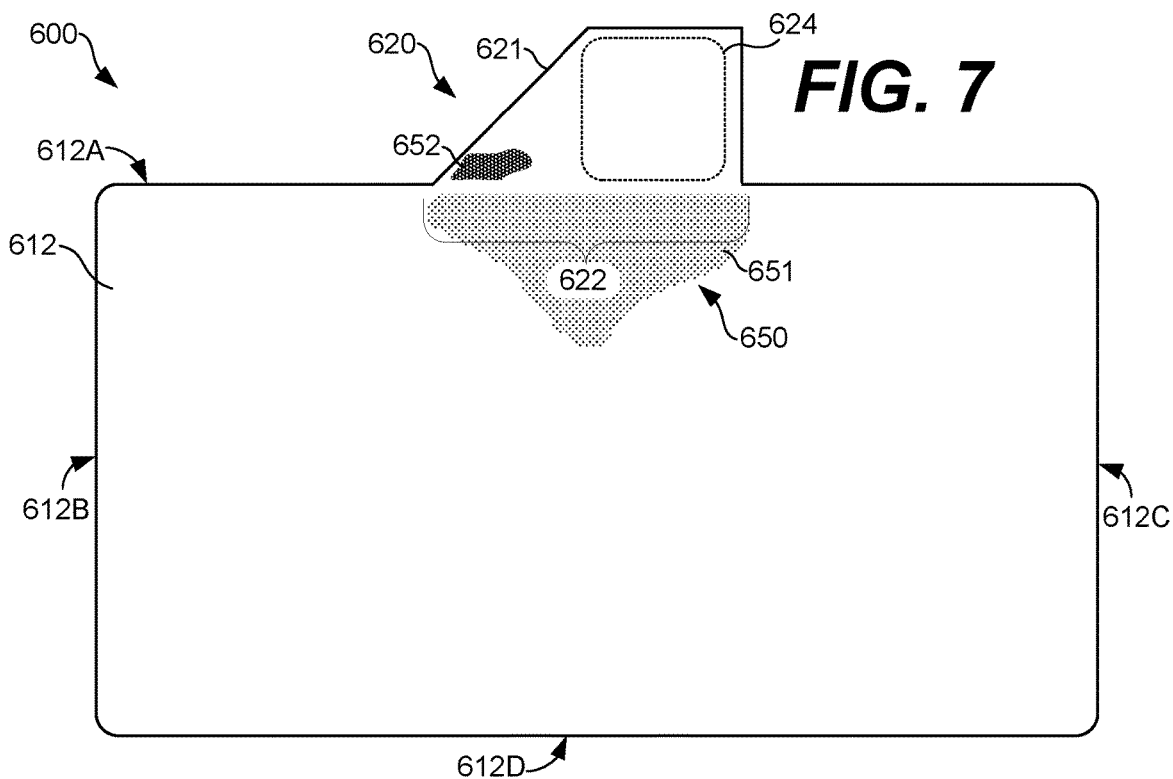
FIG. 7 illustrates another example PCB with another edge scheme projection according to various examples described herein.

FIG. 7 illustrates another example PCB 600 with another scheme projection 620 according to various examples described herein. The PCB 600 and the scheme projection 620 can be formed to other sizes and shapes as compared to that shown. Similar to the other PCBs described herein, the PCB 600 includes a board core embodied by one or more layers of core material. The board core includes a top side or surface, a bottom side or surface (not shown in FIG. 6), and a peripheral edge. The peripheral edge includes edges 612A-612D. Although the PCB 600 is shown as a type of rectangle in FIG. 6, the PCB 600 can be formed in other shapes. The PCB 600 can include metal layers on outer surfaces and between layers of the board core, similar to the other PCBs described herein. The PCB 600 can also include components mounted and electrically coupled to metal traces on the PCB 600, solder masks, and other features similar to the other PCBs described herein.

The scheme projection 620 projects out and off from the bottom side edge 612D of the PCB 600 over a projection edge region 622 of the bottom side edge 612D. The scheme projection 620 can be formed on other sides of the PCB 600 in other cases. For example, the scheme projection 620 can be formed on the right side edge 612B, the left side edge 612C, or the top side edge 612A of the PCB 600.

In one aspect of the embodiments, the projection shape of the scheme projection 620 can be based on an operational characteristic or functionality of components on the PCB 600. In the example shown, the shape of the scheme projection 620 is representative of an amplifier operation, including a side edge 621 that extends at an angle with respect to the top side edge 612A. Thus, one operational characteristic or functionality of the PCB 600 can be to act as an amplifier RF signals, and the scheme projection 620 can be representative of other operational characteristics or functionalities.

The scheme projection 620 can include a region 624, and a board configuration block can be positioned within the region 624. As examples, the board configuration blocks 160, 260, or 360, as described above and illustrated in FIGS. 1-4, can be positioned within the region 624. In other cases, the scheme projection 620 can be free from any board configuration block or other notations.

The PCB 600 also includes one or more solder mask layers. A solder mask 650 is identified in FIG. 6 on the top outer surface of the PCB 600, and a similar solder mask can be applied to the bottom outer surface of the PCB 600. Similar to the other solder masks described herein, the solder mask 650 can be embodied as one or more thin layers of polymer or other coating, with or without pigments or other additives to add color and opacity, over certain areas on the top outer surface of the PCB 600. The solder mask 650 can include a pigment or coloring in the coating layers. Example pigments include, green, red, and blue, and other colors can be relied upon.

In some cases, the solder mask 650 can highlight or identify the scheme projection 620 of the PCB 600. For example, the solder mask 650 can include a first pigment or color 651, such as blue, outside the scheme projection 620 and a second pigment or color 652, such as red, in the scheme projection 620. In that case, the scheme projection 620 can be easily identified by the two different colors. In another example, the solder mask 650 can include a first pigment or color 651, such as blue, outside the scheme projection 620 and omit any pigment or color in the scheme projection 620. In that case, the scheme projection 620 can still be identified by the difference in colors between the solder mask 650 outside the scheme projection 620 and the intrinsic color of the laminate core material of the PCB 600 in the scheme projection 620.

Figure 8:
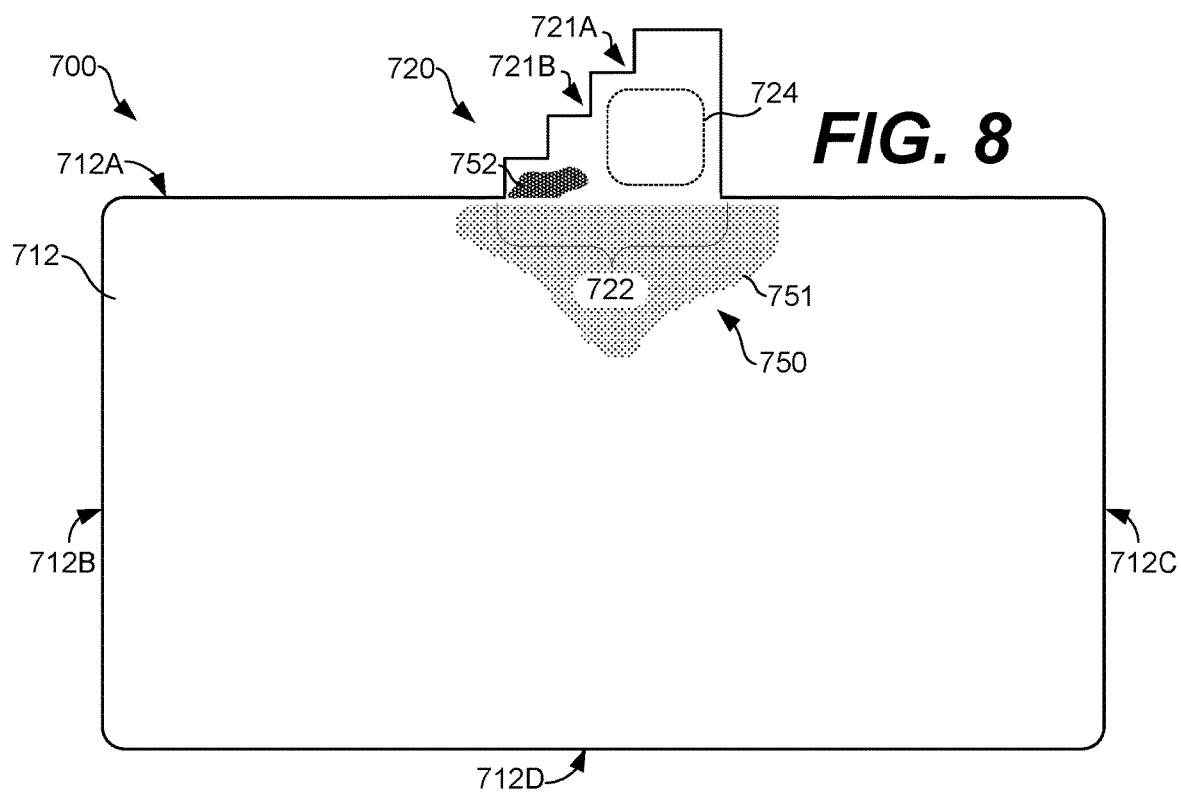
FIG. 8 illustrates another example PCB with another edge scheme projection according to various examples described herein.

FIG. 8 illustrates another example PCB 700 with another scheme projection 720 according to various examples described herein. The PCB 700 and the scheme projection 720 can be formed to other sizes and shapes as compared to that shown. Similar to the other PCBs described herein, the PCB 700 includes a board core embodied by one or more layers of core material. The board core includes a top side or surface, a bottom side or surface (not shown in FIG. 7), and a peripheral edge. The peripheral edge includes edges 712A-712D. Although the PCB 700 is shown as a type of rectangle in FIG. 7, the PCB 700 can be formed in other shapes. The PCB 700 can include metal layers on outer surfaces and between layers of the board core, similar to the other PCBs described herein. The PCB 700 can also include components mounted and electrically coupled to metal traces on the PCB 700, solder masks, and other features similar to the other PCBs described herein.

The scheme projection 720 projects out and off from the bottom side edge 712D of the PCB 700 over a projection edge region 722 of the bottom side edge 712D. The scheme projection 720 can be formed on other sides of the PCB 700 in other cases. For example, the scheme projection 720 can be formed on the right side edge 712B, the left side edge 712C, or the top side edge 712A of the PCB 700.

In one aspect of the embodiments, the projection shape of the scheme projection 720 can be based on an operational characteristic or functionality of components on the PCB 700. In the example shown, the shape of the scheme projection 720 is representative of a step attenuation operation, including steps 721A and 721B, among others, that step up with respect to the top side edge 712A. Thus, one operational characteristic or functionality of the PCB 700 can be to act as a step attenuator, and the scheme projection 720 can be representative of other operational characteristics or functionalities.

The scheme projection 720 can include a region 724, and a board configuration block can be positioned within the region 724. As examples, the board configuration blocks 160, 260, or 360, as described above and illustrated in FIGS. 1-4, can be positioned within the region 724. In other cases, the scheme projection 720 can be free from any board configuration block or other notations.

The PCB 700 also includes one or more solder mask layers. A solder mask 750 is identified in FIG. 7 on the top outer surface of the PCB 700, and a similar solder mask can be applied to the bottom outer surface of the PCB 700. Similar to the other solder masks described herein, the solder mask 750 can be embodied as one or more thin layers of polymer or other coating, with or without pigments or other additives to add color and opacity, over certain areas on the top outer surface of the PCB 700. The solder mask 750 can include a pigment or coloring in the coating layers. Example pigments include, green, red, and blue, and other colors can be relied upon.

In some cases, the solder mask 750 can highlight or identify the scheme projection 720 of the PCB 700. For example, the solder mask 750 can include a first pigment or color 751, such as blue, outside the scheme projection 720 and a second pigment or color 752, such as red, in the scheme projection 720. In that case, the scheme projection 720 can be easily identified by the two different colors. In another example, the solder mask 750 can include a first pigment or color 751, such as blue, outside the scheme projection 720 and omit any pigment or color in the scheme projection 720. In that case, the scheme projection 720 can still be identified by the difference in colors between the solder mask 750 outside the scheme projection 720 and the intrinsic color of the laminate core material of the PCB 700 in the scheme projection 720.

The board configuration blocks and scheme projections described herein can provide a range of details for the use and operation of many different PCBs, such as references to and relative locations of the components on the PCBs, input connections for the PCBs, output connections for the PCBs, operational capabilities and functions of the PCBs, and other information relied upon by individuals to operate the PCBs in one or more ways.

Figure 9:
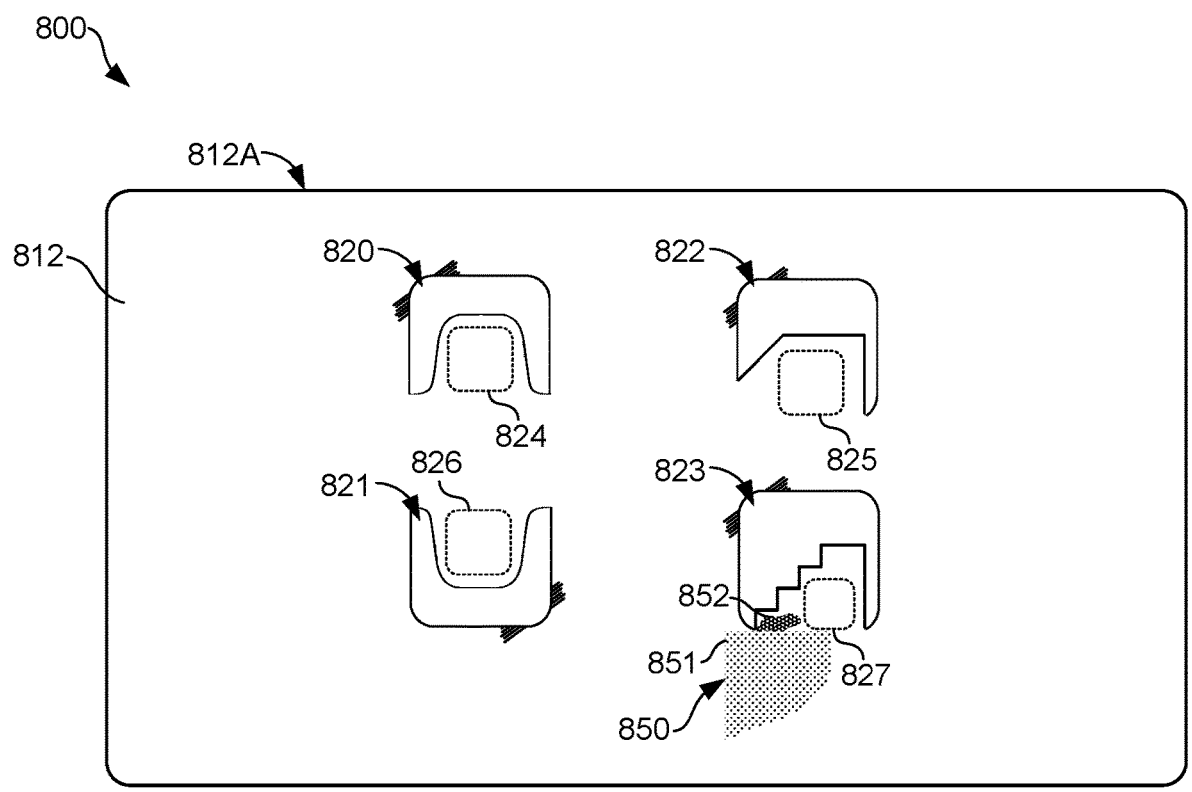
FIG. 9 illustrates another example PCB with board scheme cutouts according to various examples described herein.

FIG. 9 illustrates another example PCB 800 with board scheme cutouts 820-823 (also "scheme cutouts") according to various examples described herein. The PCB 800 and the scheme cutouts 820-823 can be formed to other sizes and shapes as compared to that shown. The scheme cutouts 820-823 are also provided as representative examples in FIG. 9, and the positions of the scheme cutouts 820-823 can vary as compared to that shown. Further, although the PCB 800 is illustrated with four scheme cutouts 820-823, the PCB 800 and other PCBs according to the concepts described herein can include only one cutout in some cases, although more than one cutout can be incorporated into a PCB. Additionally, PCBs according to the concepts described herein can include one or more board scheme cutouts according to the example shown in FIG. 9 and one or more board edge scheme projections according to the examples shown in FIGS. 5-8.

Similar to the other PCBs described herein, the PCB 800 includes a board core embodied by one or more layers of core material. The board core includes a top side or surface, a bottom side or surface (not shown in FIG. 8), and a peripheral edge 812A. Although the PCB 800 is shown as a type of rectangle in FIG. 9, the PCB 800 can be formed in other shapes. The PCB 800 can include metal layers on outer surfaces and between layers of the board core, similar to the other PCBs described herein. The PCB 800 can also include components mounted and electrically coupled to metal traces on the PCB 800, solder masks, and other features similar to the other PCBs described herein.

The scheme cutouts 820-823 are formed as apertures or cutouts that extend through the board core of the PCB 800. The internal shapes of the scheme cutouts 820-823 can be based on the operational characteristics or functionalities of components on the PCB 800. In the example shown, the shape of the scheme cutout 820 is representative of an operational diagram for a passband filter, similar to the scheme projection 420 shown in FIG. The shape of the scheme cutout 821 is representative of an operational diagram for a band stop filter, similar to the scheme projection 520 shown in FIG. 6. The shape of the scheme cutout 822 is representative of an operational diagram for an amplifier, similar to the scheme projection 620 shown in FIG. 7. The shape of the scheme cutout 823 is representative of a step attenuation operation, similar to the scheme projection 720 shown in FIG. 8. The scheme cutouts 820-823 can also be formed to have other internal shapes, contours, and features representative of other operational or functional capabilities of the PCB 800.

The scheme cutout 820 can include a region 824, and a board configuration block can be positioned within the region 824. As examples, the board configuration blocks 60, 160, 260, or 360, as described above and illustrated in FIGS. 1-4, can be positioned within the region 824. In other cases, the scheme cutout 820 can be free from any board configuration block or other notations. The scheme cutouts 821-823 can also include regions 825-827, respectively, as shown, and a board configuration block can be positioned within the regions 825-827.

The PCB 800 also includes one or more solder mask layers. A solder mask 850 is identified in FIG. 9 on the top outer surface of the PCB 800, and a similar solder mask can be applied to the bottom outer surface of the PCB 800. Similar to the other solder masks described herein, the solder mask 850 can be embodied as one or more thin layers of polymer or other coating, with or without pigments or other additives to add color and opacity, over certain areas on the top outer surface of the PCB 800. The solder mask 850 can include a pigment or coloring in the coating layers. Example pigments include, green, red, and blue, and other colors can be relied upon.

In some cases, the solder mask 850 can highlight or identify the scheme cutouts 821-823 of the PCB 800. As one example, the solder mask 850 can include a first pigment or color 851, such as blue, outside the scheme cutout 823 and a second pigment or color 852, such as red, in the scheme cutout 823. In that case, the scheme cutout 823 can be easily identified by the two different colors. In another example, the solder mask 850 can include a first pigment or color 851, such as blue, outside the scheme cutout 823 and omit any pigment or color in the scheme cutout 823. In that case, the scheme cutout 823 can still be identified by the difference in colors between the solder mask 850 outside the scheme cutout 823 and the intrinsic color of the laminate core material of the PCB 800 in the scheme cutout 823.

The board scheme cutouts described herein can provide a range of details for the use and operation of many different PCBs, such as references to and relative locations of the components on the PCBs, input connections for the PCBs, output connections for the PCBs, operational capabilities and functions of the PCBs, and other information relied upon by individuals to operate the PCBs in one or more ways.

The features, structures, and components described above may be combined in one or more embodiments in any suitable manner, and the features discussed in the various embodiments are interchangeable where technically suitable. In the foregoing description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although relative terms such as "on," "below," "upper," "lower," "top," "bottom," "right," and "left" may be used to describe the relative spatial relationships of certain structural features, these terms are used for convenience only, as a direction in the examples. It should be understood that if the device is turned upside down, the "upper" component will become a "lower" component. When a structure or feature is described as being "over" (or formed over) another structure or feature, the structure can be positioned over the other structure, with or without other structures or features intervening between them. When two components are described as being "connected to" or "coupled to" each other, the components can be electrically connected or coupled to each other, with or without other components being electrically coupled and intervening between them. When two components are described as being "directly connected to" or "directly coupled to" each other, the components can be electrically connected or coupled to each other, without other components being electrically coupled between them. Terms such as "a," "an," "the," and "said" are used to indicate the presence of one or more elements and components. The terms "comprise," "include," "have," "contain," and their variants are used to be open ended and may include or encompass additional elements, components, etc., in addition to the listed elements, components, etc., unless otherwise specified.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A printed circuit board, comprising:
   a core material; and
   a metal layer comprising a plurality of metal traces on the core material, the plurality of metal traces comprising component interconnect traces and a board configuration block, wherein the board configuration block comprises a plan diagram for the printed circuit board.

2. The printed circuit board according to claim 1, wherein the board configuration block comprises the plan diagram and an operational diagram for the printed circuit board.

3. The printed circuit board according to claim 1, wherein the plurality of metal traces further comprise a board reference indicator trace.

4. The printed circuit board according to claim 3, wherein:
   the plan diagram comprises a plan component trace and a plan reference trace within a region on the printed circuit board; and
   the board reference indicator trace is positioned outside the region on the printed circuit board.

5. The printed circuit board according to claim 4, the plan reference trace in the region corresponds to the board reference indicator trace outside the region.

6. A printed circuit board, comprising:
   a core material; and
   a metal layer comprising a plurality of metal traces on the core material, the plurality of metal traces comprising component interconnect traces and a board configuration block, wherein the board configuration block comprises an operational diagram for the printed circuit board.

7. The printed circuit board according to claim 6, wherein the operational diagram comprises a block diagram of an operational characteristic for the printed circuit board.

8. The printed circuit board according to claim 7, wherein the operational diagram comprises a switched filter bank block diagram, a switch block diagram, or a signal chain block diagram.

9. A printed circuit board, comprising:
   a core material; and
   a metal layer comprising a plurality of metal traces on the core material, the plurality of metal traces comprising component interconnect traces and a board configuration block, wherein:
      the board configuration block is positioned within a region on the printed circuit board;
      the board configuration block comprises a signal chain block diagram;
      the signal chain block diagram comprises a diagram input reference trace, a diagram output reference trace, and a diagram intermediate reference trace between the diagram input reference trace and the diagram output reference trace in the signal chain block diagram;
      the plurality of metal traces further comprise a board reference indicator trace positioned outside the region on the printed circuit board; and
      the diagram intermediate reference trace in the region corresponds to the board reference indicator trace outside the region.

10. A printed circuit board, comprising:
    a core material;
    a metal layer comprising a plurality of metal traces on the core material, the plurality of metal traces comprising component interconnect traces and a board configuration block; and
    a solder mask, the solder mask comprising a first region comprising pigment and a second region free from the pigment, wherein the board configuration block is positioned within the second region.

11. A printed circuit board, comprising:
    a core material;
    a metal layer comprising a plurality of metal traces on the core material, the plurality of metal traces comprising component interconnect traces and a board configuration block; and
    a solder mask, the solder mask comprising a first region comprising a first pigment and a second region comprising a second pigment, wherein the board configuration block is positioned within the second region.

12. The printed circuit board according to claim 1, further comprising:
    a solder mask, the solder mask comprising a board mask reference indicator, wherein:
       the board configuration block further comprises a plan reference trace; and
       the plan reference trace of the board configuration block corresponds to the board mask reference indicator of the solder mask.

13. The printed circuit board according to claim 1, wherein:
    the plan diagram comprises a plurality of plan component traces; and relative positions of the plurality of plan component traces in the plan diagram correspond to relative positions of a plurality of components connected to the component interconnect traces on the printed circuit board.

14. A printed circuit board, comprising:
a core material; and
a metal layer comprising a plurality of metal traces on the core material, the plurality of metal traces comprising component interconnect traces, a board reference indicator trace, and a board configuration block, wherein:
the board configuration block comprises a plan component trace and a plan reference trace within a region on the printed circuit board;
the board reference indicator trace is positioned outside the region on the printed circuit board; and
the plan reference trace in the region corresponds to the board reference indicator trace outside the region.

15. The printed circuit board according to claim 14, wherein the board configuration block further comprises an operational diagram for the printed circuit board, the operational diagram comprising a switched filter bank block diagram, a switch block diagram, or a signal chain block diagram.

16. A printed circuit board, comprising:
a core material comprising a peripheral edge, the peripheral edge comprising a board edge scheme projection positioned along a projection edge region of the peripheral edge.

17. The printed circuit board according to claim 16, wherein the board edge scheme projection includes a projection shape based on an operational characteristic for the printed circuit board.

18. The printed circuit board according to claim 16, wherein the board edge scheme projection includes a projection shape based on a filter operational characteristic for the printed circuit board, an amplifier operational characteristic, or a step attenuator operational characteristic for the printed circuit board.

19. A printed circuit board, comprising:
a core material comprising a peripheral edge, the peripheral edge comprising a board edge scheme projection positioned along a projection edge region of the peripheral edge, wherein the core material further comprises a board scheme cutout that extends through the core material within the peripheral edge of the printed circuit board.

20. A printed circuit board, comprising:
a core material comprising a peripheral edge, the peripheral edge comprising a board edge scheme projection positioned along a projection edge region of the peripheral edge; and
a solder mask, the solder mask comprising a first region comprising pigment and a second region free from the pigment, wherein the board edge scheme projection is positioned within the second region.

* * * * *